(12) United States Patent
Wei et al.

(10) Patent No.: US 8,227,916 B2
(45) Date of Patent: Jul. 24, 2012

(54) PACKAGE STRUCTURE AND METHOD FOR REDUCING DIELECTRIC LAYER DELAMINATION

(75) Inventors: Hsiu-Ping Wei, Dajia Town (TW); Shin-Puu Jeng, Hsinchu (TW); Hao-Yi Tsai, Hsinchu (TW); Hsien-Wei Chen, Sinying (TW); Yu-Wen Liu, Taipei (TW); Ying-Ju Chen, Tuku Township (TW); Tzuan-Horng Liu, Longtan Township (TW)

(73) Assignee: Taiwan Semiconductor Manufacturing Company, Ltd.

( * ) Notice: Subject to any disclaimer, the term of this patent is extended or adjusted under 35 U.S.C. 154(b) by 181 days.

(21) Appl. No.: 12/757,440

(22) Filed: Apr. 9, 2010

(65) Prior Publication Data
US 2011/0018128 A1 Jan. 27, 2011

Related U.S. Application Data

(60) Provisional application No. 61/227,558, filed on Jul. 22, 2009.

(51) Int. Cl.
*H01L 23/498* (2006.01)
*H01L 21/3205* (2006.01)

(52) U.S. Cl. ........... 257/737; 257/E23.07; 257/E21.294; 257/738; 257/778; 257/772; 257/779; 257/734

(58) Field of Classification Search .............. 257/737, 257/E23.07, E21.294, 738, 778, 772, 779, 257/734
See application file for complete search history.

(56) References Cited

U.S. PATENT DOCUMENTS

| 7,468,545 | B2* | 12/2008 | Lin et al. | 257/622 |
|---|---|---|---|---|
| 2003/0168734 | A1* | 9/2003 | Fang | 257/734 |
| 2007/0001301 | A1* | 1/2007 | Wang | 257/734 |
| 2007/0023925 | A1* | 2/2007 | Ke et al. | 257/779 |
| 2008/0230925 | A1* | 9/2008 | Do et al. | 257/778 |
| 2010/0164096 | A1* | 7/2010 | Daubenspeck et al. | 257/737 |
| 2010/0224966 | A1* | 9/2010 | Chen | 257/621 |
| 2011/0049706 | A1* | 3/2011 | Huang et al. | 257/737 |
| 2011/0175220 | A1* | 7/2011 | Kuo et al. | 257/737 |
| 2011/0284843 | A1* | 11/2011 | Chen et al. | 257/48 |

* cited by examiner

*Primary Examiner* — Alexander O Williams
(74) *Attorney, Agent, or Firm* — Lowe Hauptman Ham & Berner, LLP

(57) ABSTRACT

A semiconductor package structure is provided. The structure includes a semiconductor chip having a plurality of interconnect layers formed thereover. A first passivation layer is formed over the plurality of interconnect layers. A stress buffer layer is formed over the first passivation layer. A bonding pad is formed over the stress buffer layer. A second passivation layer is formed over a portion of the bonding pad, the second passivation having at least one opening therein exposing a portion of the bonding pad.

20 Claims, 4 Drawing Sheets

PACKAGE STRUCTURE AND METHOD FOR REDUCING DIELECTRIC LAYER DELAMINATION

CROSS-REFERENCE TO RELATED APPLICATIONS

The present application claims priority of U.S. Provisional Patent Application Ser. No. 61/227,558, filed on Jul. 22, 2009 which is incorporated herein by reference in its entirety.

TECHNICAL FIELD

The present disclosure relates generally to semiconductor wafer packaging, and more particularly, to solder bump and wire bond structures and methods for reducing dielectric layer delamination.

BACKGROUND

A critical issue that is challenging the whole micro-electronics industry is the delamination of inter-level dielectric (ILD) layers on a semiconductor chip below the bonding pad in a solder bump or wire bond structure. This is a particularly large problem for delicate, conventional low-k dielectric layers and brittle, porous low-k dielectric layers. Low-k delamination is generally caused by a high stress concentration that is present under the bonding pad after the solder bump or the bond wire is made. With current designs, the load upon the ILD layers directly beneath the bonding pad is highly concentrated due to shear stresses from thermal expansion mismatches and normal stresses due to warping behavior.

Because the use of porous low-k dielectric materials is becoming standard in the industry, there is a need for improved solder bump or bond wire structures and methods to reduce the delamination of ILD layers.

BRIEF DESCRIPTION OF DRAWINGS

The features, aspects, and advantages of the disclosure will become more fully apparent from the following detailed description, appended claims, and accompanying drawings in which:

DETAILED DESCRIPTION

Described herein are structures and methods of reducing the delamination of inter-level dielectric (ILD) layers during and after the solder bump or bond wire connection processes. In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials, and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations. It is to be understood further that the drawings are not drawn to scale but presented in a way to enable understanding of the embodiments of the disclosure.

Various operations will be described as multiple discrete operations, in turn, in a manner that is most helpful in understanding the embodiments of the present disclosure; however, the order of description should not be construed to imply that these operations are necessarily order dependent. In particular, these operations need not be performed in the order of presentation.

Figure 1:
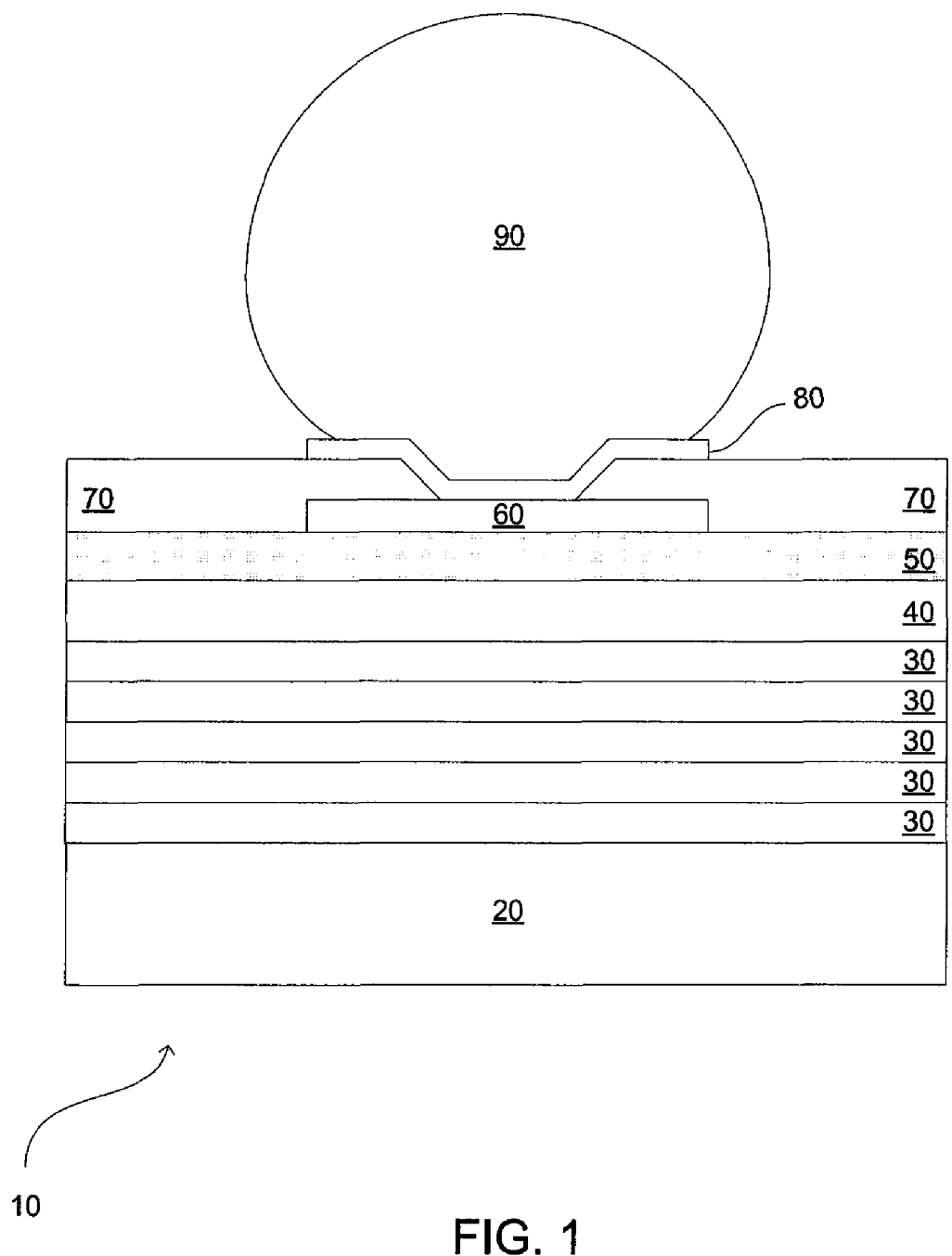
FIG. 1 is a cross-sectional view of a solder bump structure, according to one embodiment of the present invention.

FIG. 1 is a cross-sectional view of a solder bump structure, according to one embodiment of the present disclosure. A semiconductor chip 10 is shown, wherein the semiconductor chip 10 includes a semiconductor substrate 20. Formed on or within the semiconductor substrate 20 are devices such as transistors, capacitors, and interconnects (not shown). On a top surface of the semiconductor substrate 20 are formed multiple interconnect layers 30 that serve to further interconnect the various devices on the semiconductor substrate 20. The interconnect layers 30 may include metallization layers consisting of metal interconnects separated by dielectric material. The interconnect layers 30 may also include inter-level dielectric (ILD) layers used to separate and insulate the metallization layers from one another. Vias may penetrate through the ILD layers to connect the metallization layers together. The interconnected devices form an integrated circuit (IC).

A first passivation layer 40 is generally formed atop the final interconnect layer 30. The first passivation layer 40 seals and protects the integrate circuit and interconnect layers 30 from damage and contamination. The first passivation layer 40 may be formed from many different materials, including but not limited to silicon oxide, silicon dioxide, polyimide, silicon nitride, nitride oxide, USG, FSG, or PSG. The first passivation layer 40 may be formed using well-known processes in the art that include, but are not limited to, chemical vapor deposition (CVD), plasma enhanced chemical vapor deposition (PECVD), spin-on processes, etc. The first passivation layer 40 has a thickness of from about 5,000 Angstroms to about 20,000 Angstroms, according to one embodiment of the present disclosure.

Also shown in FIG. 1 is a novel stress buffer layer 50 that is formed over the first passivation layer 40. The stress buffer layer 50 is utilized to absorb and redistribute the stress concentration on the underlying ILD layers created by the shear stresses from thermal expansion mismatches and normal stresses due to warping behavior. By absorbing and redistributing the stress load away from the center portions of the semiconductor chip 10 to over a larger volume, the stress load on portions of the interconnect layers 30 will be significantly decreased, thereby reducing the likelihood of low-k dielectric layer delamination. In some embodiments, the low-k dielectric layer delamination may be reduced or even eliminated if the stress concentration can be effectively reduced. The stress buffer layer 50 has a coefficient of thermal expansion (CTE) of less than about 20 ppm/° C. and a Young's Modulus of less than about 15 GPa, according to one embodiment of the present disclosure.

The stress buffer layer 50 comprises of polyimide, a dielectric material or an epoxy-based material and may be formed by conventional methods, such as for example, deposition, spin coating, or taping. It is understood that the stress buffer layer 50 may comprise of other like materials so long as the material is capable of absorbing and distributing the stress load so that the stress load on the interconnect layers 30 is decreased. In one embodiment, the stress buffer layer 50 has a thickness of from about 5,000 Angstroms to about 100,000 Angstroms. In some embodiments, the stress buffer layer 50 has a thickness of from about 10,000 Angstroms to about 50,000 Angstroms.

Still referring to FIG. 1, one or more bonding pads 60 may be formed over the stress buffer layer 50. The bonding pad 60 may then couple metallization layers within the interconnect layers 30 to electrical elements outside of the semiconductor chip 10. The bonding pad 60 may be formed using a metal such as copper or aluminum. A second or final passivation layer 70 is generally formed over portions of the bonding pad 60 and the stress buffer layer 50. The second passivation layer 70 may be formed from many different materials, including but not limited to silicon oxide, silicon dioxide, polyimide, silicon nitride, nitride oxide, USG, FSG, or PSG. The second passivation layer 70 may be formed using well-known processes in the art that include, but are not limited to, chemical vapor deposition (CVD), plasma enhanced chemical vapor deposition (PECVD), spin-on processes, etc. The second passivation layer has a thickness of from about 10,000 Angstroms to about 30,000 Angstroms, according to one embodiment of the present disclosure. Openings may be etched in the second passivation layer 70 allowing electrical elements in the environment outside of the semiconductor chip 10 to access the interconnect layers 30, for instance, electrical probes and/or wire bonds that are part of a carrier (e.g., a motherboard) upon which the semiconductor chip 10 is mounted.

A conventional under bump metallization (UBM) layer 80 is formed over the bonding pad 60 and the second passivation layer 70. The UBM layer 80 is generally a layer of one or several metals over the bonding pad 60 and is used to create a barrier between the fragile bonding pad 60 and a metal bump or solder bump 90. Metals used for the UBM layer 80 include, but are not limited to, one or more of copper, aluminum, nickel, titanium, and chromium. The metals used in the UBM layer 80 are electrically conductive to pass current between the bonding pad 60 and the solder bump 90. The UBM layer 80 may be formed using well know processes in the art that includes, but are not limited to, CVD, physical vapor deposition (PVD), atomic layer deposition (ALD), PECVD, sputtering deposition, electroplating, and electroless plating.

Figure 2:
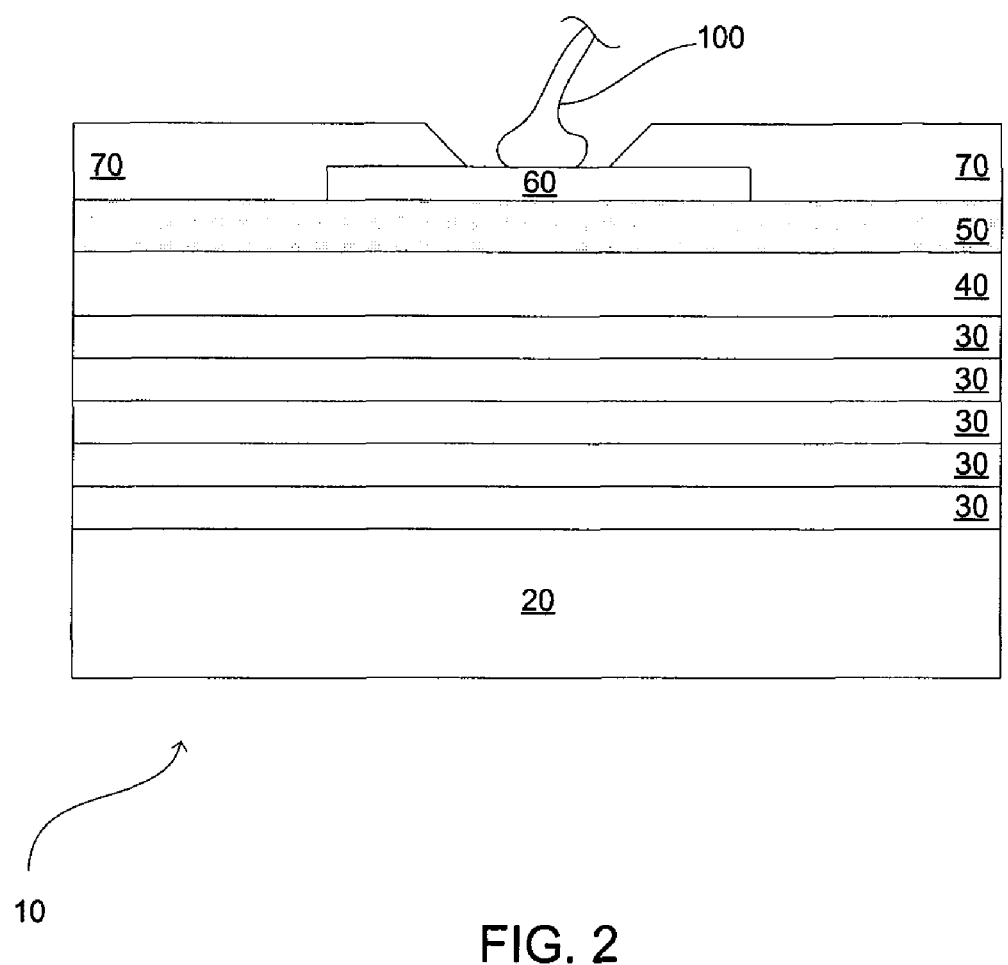
FIG. 2 is a cross-sectional view of a wire bond structure, according to one embodiment of the present invention.

The solder bump 90 resting above the UBM layer 80, provides the final electrical connection between the interconnect layers 30 and the environment outside of the semiconductor chip 10. The solder bump 90 is generally formed using a metal such as copper, a copper alloy, or an alloy of lead and tin. The solder bump 90 may be formed using well known processes in the art that include, but are not limited to, CVD, PVD, ALD, PECVD, electroplating, and electroless plating. FIG. 2 shows an alternate way of providing the final electrical connection between the interconnect layers 30 and the environment outside the semiconductor chip 10. Here, a bond wire 100 is connected to an exposed portion of the bonding pad 60.

Figure 3:
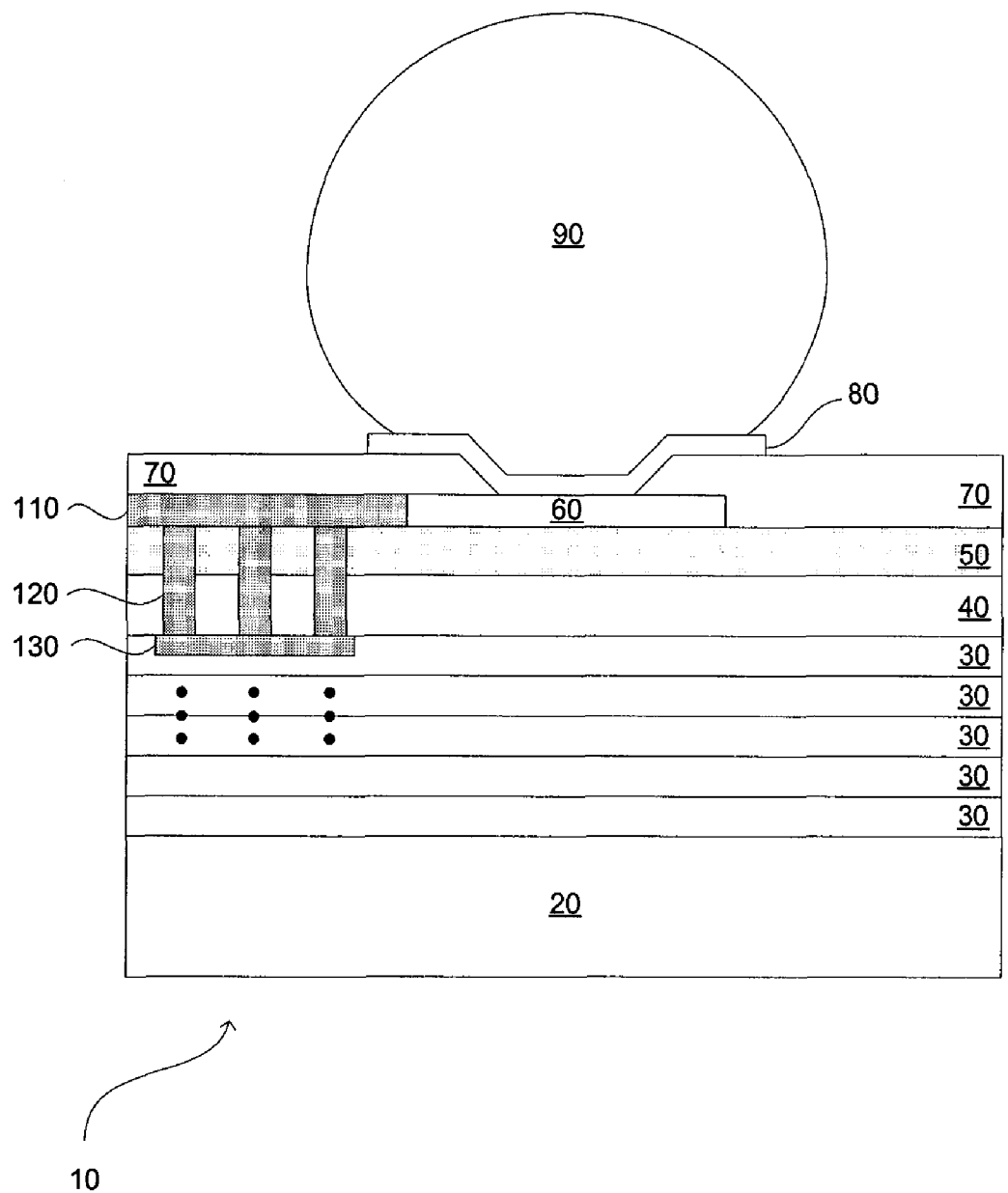
FIG. 3 is a cross-sectional view of a solder bump structure, according to another embodiment of the present invention.

FIG. 3 is a cross-sectional view of a solder bump structure comprising the stress buffer layer, according to another embodiment of the present disclosure. FIG. 3 shows a redistribution layer 110 formed over the semiconductor chip 10 so that one end is in electrical contact with the bonding pad 60 and the opposite end extending a distance horizontally away from the contact pad. The redistribution layer 110 may be made from any electrically conductive material and in one embodiment is made from a copper based material that is either screen printed, selectively electroplated, or electroplated over the entire surface of the wafer and excess portions removed by etching, or is formed by any other method known to those skilled in the art. According to one embodiment of the present disclosure, one or more via plugs 120 are formed through the stress buffer layer 50, the one or more via plugs 120 having first ends electrically connected to the redistribution layer 110 and second ends electrically connected to an underlying metal layer 130 embedded in the interconnect layer 30. Via plugs 120 may include aluminum, copper, doped silicon, tungsten or other conductive materials. Although not shown, it is understood that the via plugs may extend down to lower interconnect layers 30.

Figure 4:
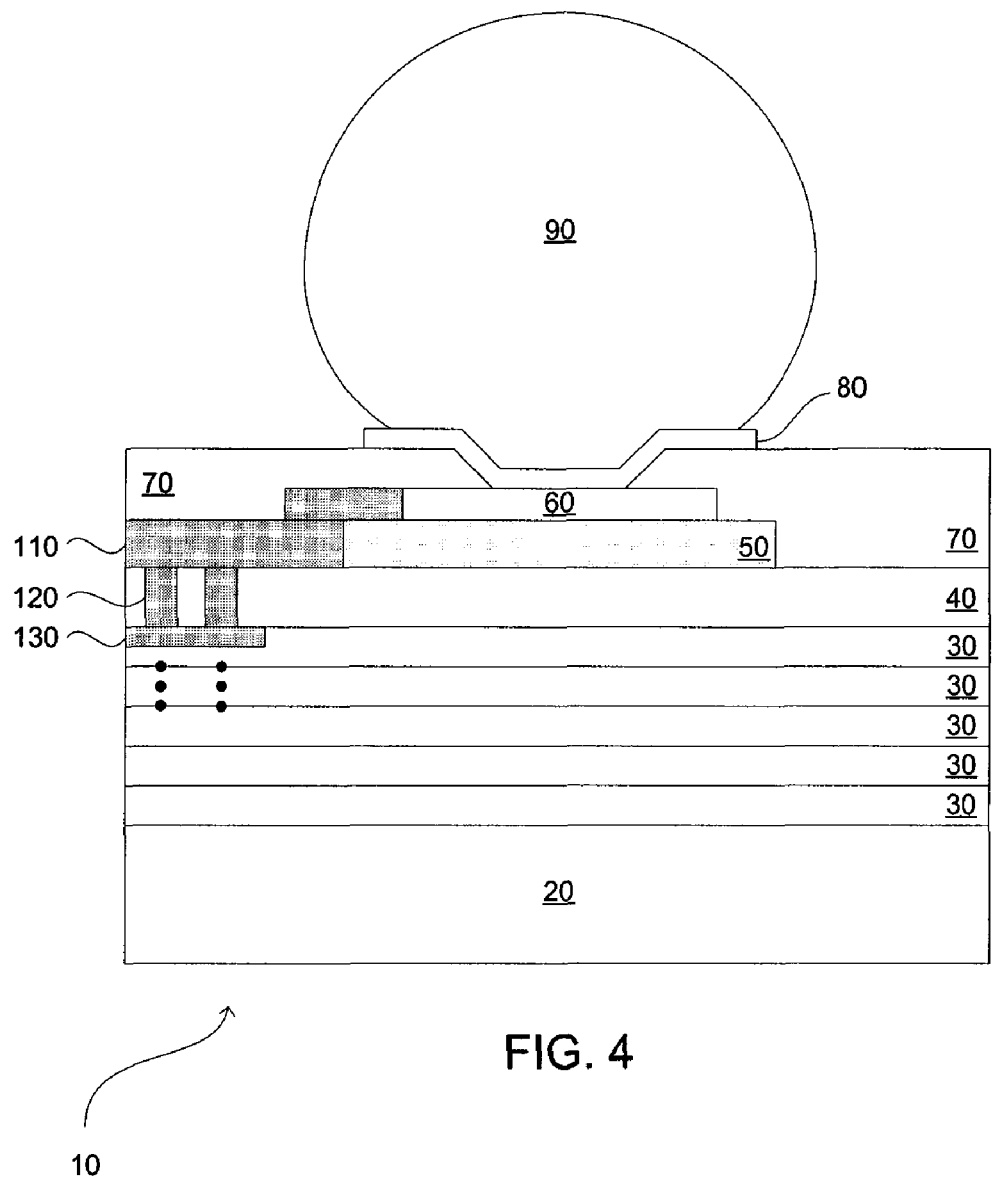
FIG. 4 is a cross-sectional view of a solder bump structure, according to yet another embodiment of the present invention.

According to another embodiment of the present disclosure, the redistribution layer 110 has a staggered formation where the via plugs 120 are formed through the first passivation layer 40 but not through the stress buffer layer 50. In FIG. 4, the redistribution layer 110 is formed in a staggered configuration where one end is in electrical contact with the bonding pad 60 and the other end is extended and staggered horizontally away from the stress buffer layer 50. The one or more via plugs 120 are formed through the first passivation layer 40 but not the stress buffer layer 50, the one or more via plugs 120 having first ends electrically connected to the redistribution layer 110 and second ends electrically connected to the underlying metal layer 130 in the interconnect layer 30. Although not shown, it is understood that the via plugs may extend down to lower interconnect layers 30. FIGS. 3 and 4 show but two of several configurations of the redistribution layer 110 and the via plugs 120 and other such configurations as they are understood by those skilled in the art may also be contemplated.

Accordingly, various embodiments of the present disclosure utilizing the stress buffer layer 50 have been disclosed. These various embodiments use the stress buffer layer 50 to absorb and redistribute the stress load created by thermal expansion mismatches and the solder bump, for example, over a larger volume of the passivation layer 40 and the interconnect layers 30, thereby minimizing the likelihood of delamination of the interconnect layers 30.

The preceding disclosure was described with reference to exemplary embodiments of the present disclosure. It will, however, be evident that various modifications, structures, processes, and changes may be made thereto without departing from the broader spirit and scope of the embodiments of the present disclosure, as set forth in the claims. For example, the geometric orientations of the stress buffer layer, first and second passivation layers, redistribution layers and the via plugs may be altered to have different shapes without departing from the scope of the disclosure. Accordingly, these layers may take flat (uniform in cross-section) or non-flat (non-uniform in cross-section) configurations. The specification and drawings are, accordingly, to be regarded as illustrative and not restrictive. It is understood that embodiments of the present disclosure are capable of using various other combinations and environments and are capable of changes or modifications within the scope of the inventive concept as expressed herein.

What is claimed is:
1. A semiconductor structure, comprising:
  a semiconductor chip having a plurality of interconnect layers formed thereover;
  a first passivation layer formed over the plurality of interconnect layers;
  a stress buffer layer formed over the first passivation layer;
  a bonding pad formed over the stress buffer layer;

a second passivation layer formed over a portion of the bonding pad, the second passivation having at least one opening therein exposing a portion of the bonding pad; and a redistribution layer having one end electrically connected to the bonding pad.

2. The semiconductor structure of claim 1, wherein the first passivation layer comprises silicon oxide, silicon dioxide, polyimide, silicon nitride, nitride oxide, USG, FSG, or PSG and has a thickness of from about 5,000 Angstroms to about 20,000 Angstroms.

3. The semiconductor structure of claim 1, wherein the stress buffer layer comprises polyimide, a dielectric material or an epoxy-based material.

4. The semiconductor structure of claim 1, wherein the stress buffer layer has a thickness of between about 5,000 Angstroms to about 100,000 Angstroms.

5. The semiconductor structure of claim 4, wherein the stress buffer layer has a thickness of between about 10,000 Angstroms to about 50,000 Angstroms.

6. The semiconductor structure of claim 1, wherein the stress buffer layer is formed by deposition, spin coating, or taping.

7. The semiconductor structure of claim 1, wherein the stress buffer layer has a coefficient of thermal expansion (CTE) of less than about 20 ppm/° C. and a Young's Modulus of less than about 15 GPa.

8. The semiconductor structure of claim 1, wherein the second passivation layer comprises silicon oxide, silicon dioxide, polyimide, silicon nitride, nitride oxide, USG, FSG, or PSG and has a thickness of between about 10,000 Angstroms to about 30,000 Angstroms.

9. The semiconductor structure of claim 1, wherein the second passivation layer is formed over a portion of the stress buffer layer.

10. The semiconductor structure of claim 1, further comprising a bond wire in electrical contact to an exposed portion of the bonding pad.

11. The semiconductor structure of claim 1, further comprising an under bump metallization (UBM) layer formed over a portion of the second passivation layer and a solder bump formed atop the UBM layer.

12. The semiconductor structure of claim 1, wherein the redistribution layer is formed proximate to the stress buffer layer.

13. The semiconductor structure of claim 1, further comprising one or more via plugs formed through the stress buffer layer and the first passivation layer, the one or more via plugs each having first ends electrically connected to the redistribution layer and second ends electrically connected to an underlying metal layer.

14. The semiconductor structure of claim 1, further comprising one or more via plugs formed through the first passivation layer, the one or more via plugs each having first ends electrically connected to the redistribution layer and second ends electrically connected to an underlying metal layer.

15. An IC package structure, comprising:
a semiconductor chip having a plurality of interconnect layers formed thereover;
a first passivation layer formed over the plurality of interconnect layers;
a stress buffer layer formed over the first passivation layer;
a bonding pad formed over the stress buffer layer;
a second passivation layer formed over portions of the bonding pad and the stress buffer layer, the second passivation having at least one opening therein exposing a portion of the bonding pad;
an under bump metallization (UBM) layer formed over the second passivation layer and the bonding pad, the UBM layer in electrical contact with the bonding pad;
a solder bump formed atop the UBM layer; and
a redistribution layer formed proximate to the stress buffer layer.

16. The IC package structure of claim 15, wherein the redistribution layer having one end electrically connected to the bonding pad.

17. The IC package structure of claim 15, further comprising one or more via plugs formed through the stress buffer layer, the one or more via plugs each having first ends electrically connected to the redistribution layer and a second ends electrically connected to an underlying metal layer.

18. The IC package structure of claim 15, further comprising one or more via plugs formed through the first passivation layer, the one or more via plugs each having first ends electrically connected to the redistribution layer and second ends electrically connected to an underlying metal layer.

19. A method of forming a semiconductor package structure, comprising:
providing a semiconductor chip having a plurality of interconnect layers formed thereover;
forming a first passivation layer over the plurality of interconnect layers;
forming a stress buffer layer over the first passivation layer;
forming a bonding pad over the stress buffer layer;
forming a second passivation layer over portions of the stress buffer layer and the bonding pad, the second passivation having at least one opening therein exposing a portion of the bonding pad;
depositing an under bump metallization (UBM) layer over the second passivation layer and the bonding pad;
forming a solder bump formed atop the UBM layer; and
forming a redistribution layer electrically connected to the bonding pad.

20. The method of claim 19, wherein the stress buffer layer comprises polyimide, a dielectric material or an epoxy-based material and has a thickness of from about 5,000 Angstroms to about 100,000 Angstroms.

* * * * *